(12) United States Patent
Park et al.

(10) Patent No.: US 10,070,441 B2
(45) Date of Patent: Sep. 4, 2018

(54) METHOD AND APPARATUS FOR GENERATING CODEWORD, AND METHOD AND APPARATUS FOR RECOVERING CODEWORD

(71) Applicant: Samsung Electronics Co., Ltd, Gyeonggi-do (KR)

(72) Inventors: Woomyoung Park, Gyeonggi-do (KR); Sangmin Kim, Gyeonggi-do (KR); Chiwoo Lim, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 73 days.

(21) Appl. No.: 15/304,844

(22) PCT Filed: Apr. 16, 2015

(86) PCT No.: PCT/KR2015/003843
§ 371 (c)(1),
(2) Date: Oct. 17, 2016

(87) PCT Pub. No.: WO2015/160205
PCT Pub. Date: Oct. 22, 2015

(65) Prior Publication Data
US 2017/0188367 A1 Jun. 29, 2017

(30) Foreign Application Priority Data

Apr. 17, 2014 (KR) ......................... 10-2014-0046245

(51) Int. Cl.
*H04W 72/04* (2009.01)
*H04L 1/00* (2006.01)
(Continued)

(52) U.S. Cl.
CPC ..... *H04W 72/0466* (2013.01); *H03M 13/255* (2013.01); *H03M 13/6525* (2013.01); *H04L 1/0071* (2013.01)

(58) Field of Classification Search
CPC ............ H03M 13/255; H03M 13/6525; H04L 1/0071; H04W 72/0466
See application file for complete search history.

(56) References Cited

U.S. PATENT DOCUMENTS 7,409,001 B2 * 8/2008 Ionescu ................ H04B 7/0417
375/267
7,657,822 B2 * 2/2010 Shen .................... H03M 13/256
375/265
(Continued)

FOREIGN PATENT DOCUMENTS

JP          3636709 B2      4/2005
KR    10-2008-0104684      12/2008
(Continued)

OTHER PUBLICATIONS

International Search Report dated Jul. 23, 2015 in connection with International Patent Application No. PCT/KR2015/003843, 7 pages.
(Continued)

*Primary Examiner* — Kashif Siddiqui

(57) ABSTRACT

Disclosed are a method and an apparatus for generating a codeword, and a method and an apparatus for recovering a codeword. An encoder calculates the number of punctured symbol nodes among symbol nodes included in a codeword, punctures symbol nodes located at even or odd number positions among the symbol nodes included in the codeword, calculates the number of symbol nodes which need to be additionally punctured on the basis of the calculated number of the symbol nodes to be punctured, classifies the symbol nodes, which need to be additionally punctured, into one or more punctured node groups on the basis of the (Continued)

calculated number of symbol nodes which need to be punctured, determines the locations on the codeword where the one or more punctured node groups are to be arranged, and punctures the symbol nodes included in the codeword which belong to the punctured node groups according to the determined locations. A transmission unit transmits the codeword.

20 Claims, 17 Drawing Sheets

(51) Int. Cl.
*H03M 13/00* (2006.01)
*H03M 13/25* (2006.01)

(56) References Cited

U.S. PATENT DOCUMENTS

| | | | |
|---|---|---|---|
| 8,031,793 B2 * | 10/2011 | Ionescu | H04L 1/0041 375/267 |
| 2002/0114401 A1 | 8/2002 | Kim et al. | |
| 2004/0133841 A1 * | 7/2004 | Lundby | H03M 13/6375 714/790 |
| 2007/0288834 A1 | 12/2007 | Crozier et al. | |
| 2008/0072124 A1 * | 3/2008 | Chiou | H03M 13/256 714/790 |
| 2009/0259913 A1 | 10/2009 | Myung et al. | |
| 2012/0096336 A1 * | 4/2012 | Nakamura | H03M 13/258 714/790 |
| 2012/0166917 A1 | 6/2012 | El-Khamy et al. | |
| 2012/0216099 A1 | 8/2012 | Jeong et al. | |
| 2014/0079150 A1 * | 3/2014 | Tong | H04L 1/0068 375/295 |

FOREIGN PATENT DOCUMENTS

| | | |
|---|---|---|
| KR | 10-2012-0056443 | 6/2012 |
| KR | 10-1267756 B1 | 5/2013 |
| KR | 10-2014-0036346 | 3/2014 |

OTHER PUBLICATIONS

Written Opinion of the International Searching Authority dated Jul. 23, 2015 in connection with International Patent Application No. PCT/KR2015/003843, 8 pages.
Jeongseok Ha, et al., Puncturing for Finite Length Low-Density Parity-Check Codes, ISIT 2004, IEEE, Chicago, Illinois, Jun. 27-Jul. 2, 2004, 1 page.
Albert Guillen, et al., "Capacity Approaching Codes for Non-Coherent Orthogonal Modulation", IEEE Transactions on Wireless Communications, vol. 6, No. 11, Nov. 2007, 10 pages.
Communication from a foreign patent office in a foreign counterpart application, European Patent Office, "Supplementary European Search Report," Application No. EP 15 77 9293.8, dated Jan. 4, 2018, 11 pages.
Brink, Stephan Ten, "Code Doping for Triggering Iterative Decoding Convergence," Proceedings of the 2001 IEEE International Symposium on Information Theory, ISIT2001, Washington, DC, Jun. 24-29, 2001, 1 page.
Ghosh, Arindam, et al., "Throughput and Energy Efficiency of a Cooperative Hybrid ARQ Protocol for Underwater Acoustic Sensor Networks," Sensors 2013, vol. 13, No. 11, Nov. 8, 2013, ISSN 1424-8220, doi:10.3390/s131115385, 24 pages.
Wikipedia, "Puncturing," https://en.wikipedia.org/w/index.php?title=Puncturing&oldid=602381624, Apr. 2, 2014, 1 page.

\* cited by examiner

METHOD AND APPARATUS FOR GENERATING CODEWORD, AND METHOD AND APPARATUS FOR RECOVERING CODEWORD

CROSS-REFERENCE TO RELATED APPLICATION(S)

The present application claims priority under 35 U.S.C. § 365 to International Patent Application No. PCT/KR2015/003843 filed Apr. 16, 2015, entitled "METHOD AND APPARATUS FOR GENERATING CODEWORD, AND METHOD AND APPARATUS FOR RECOVERING CODEWORD", and, through International Patent Application No. PCT/KR2015/003843, to Korean Patent Application No. 10-2014-0046245 filed Apr. 17, 2014, each of which are incorporated herein by reference into the present disclosure as if fully set forth herein.

TECHNICAL FIELD

The present disclosure relates to a method for transmitting and receiving data in a wireless communication system, and more particularly, to a method and an apparatus for generating a codeword, and a method and an apparatus for recovering a codeword.

BACKGROUND ART

In channel coding technology, it is important to make it possible to freely and variably adjust the code rate of a channel. For example, in the case of a wireless communication system, a receiver measures a channel state and transmits channel state information to a sender, and the sender determines the code rate of a code to be used on the basis of the received information. In this case, codes having various code rates are required in accordance with the channel state of the receiver. Accordingly, it is inevitably required to provide a method for designing a code having a variable code rate.

In the case of designing a code having a variable code rate through puncturing using the existing LDPC code, a puncturing pattern has been designed on the basis of the concept of a k-Step Recoverable (hereinafter, kSR) node that is information about the number of times of decoding for a punctured symbol node to receive a reliable message during a repetitive decoding process. According to this designing method, the puncturing pattern is designed so that the maximum value of a recoverable step of a puncturing node becomes a value as small as possible.

In the case of designing a puncturing pattern of a BICM-ID structure using an Irregular Repetition (hereinafter, IR) code, in the same manner as the LDPC code, it may be first considered to use the concept of the kSR node.

However, according to the above-described method, it is easy to find the puncturing pattern that corresponds to the respective code rates, but it is general that the puncturing pattern having a low code rate does not become a subset of the puncturing pattern having a high code rate. This may cause a problem when a rate-compatible structure that supports various code rates with one code is designed.

DISCLOSURE OF INVENTION

Technical Problem

The present disclosure has been made in order to solve the above problems, and an aspect of the present disclosure provides a method and an apparatus for generating a codeword, and a method and an apparatus for recovering a codeword, which can enable a normal operation to be performed even in the case of performing puncturing at a high code rate in a Bit-Interleaved Coded Modulation with Iterative Decoding (BICM-ID) structure based on an IR code.

Another aspect of the present disclosure provides a method and an apparatus for generating a codeword, and a method and an apparatus for recovering a codeword, which can facilitate the design of a rate-compatible structure that can support various code rates.

Solution to Problem

In one aspect of the present disclosure, a method for generating a codeword includes: calculating the number of punctured symbol nodes among symbol nodes included in a codeword; puncturing symbol nodes located at even or odd number positions among the symbol nodes included in the codeword; calculating the number of symbol nodes which need to be additionally punctured on the basis of the calculated number of the symbol nodes to be punctured; classifying the symbol nodes, which need to be additionally punctured, into one or more punctured node groups on the basis of the calculated number of symbol nodes which need to be punctured; determining the locations on the codeword where the one or more punctured node groups are to be arranged; and puncturing the symbol nodes included in the codeword which belong to the punctured node groups according to the determined locations.

In another aspect of the present disclosure, an apparatus for generating a codeword includes: an encoder which calculates the number of punctured symbol nodes among symbol nodes included in a codeword, punctures symbol nodes located at even or odd number positions among the symbol nodes included in the codeword, calculates the number of symbol nodes which need to be additionally punctured on the basis of the calculated number of the symbol nodes to be punctured, classifies the symbol nodes, which need to be additionally punctured, into one or more punctured node groups on the basis of the calculated number of symbol nodes which need to be punctured, determines the locations on the codeword where the one or more punctured node groups are to be arranged, and punctures the symbol nodes included in the codeword which belong to the punctured node groups according to the determined locations; and a transmission unit which transmits the codeword.

In still another aspect of the present disclosure, a method for recovering a codeword includes: receiving a codeword, wherein the received codeword is generated by puncturing symbol nodes located at even or odd number positions among symbol nodes included in the codeword, classifying the symbol nodes, which need to be additionally punctured, into one or more punctured node groups, and puncturing the symbol nodes which belong to the punctured node groups according to the locations on the codeword where the one or more punctured node groups are arranged; demodulating the received codeword; and decoding the demodulated codeword.

In yet still another aspect of the present disclosure, a receiver includes: a reception unit configured to receive a codeword; a demodulation unit configured to demodulate the received codeword; and a decoder configured to decode the demodulated codeword, wherein the received codeword is generated by puncturing symbol nodes located at even or odd number positions among symbol nodes included in the codeword, classifying the symbol nodes, which need to be additionally punctured, into one or more punctured node groups, and puncturing the symbol nodes which belong to the punctured node groups according to the locations on the codeword where the one or more punctured node groups are arranged.

Advantageous Effects of Invention

According to the method and the apparatus for generating a codeword, and the method and the apparatus for recovering a codeword according to the present disclosure, it is possible to generate the puncturing pattern that can perform the normal operation even in the case of performing the puncturing at a high code rate in the Bit-Interleaved Coded Modulation with Iterative Decoding (BICM-ID) structure based on the IR code, and it is possible to easily generate the codeword having the rate-compatible structure that can support various code rates.

MODE FOR THE INVENTION

Figure 1:
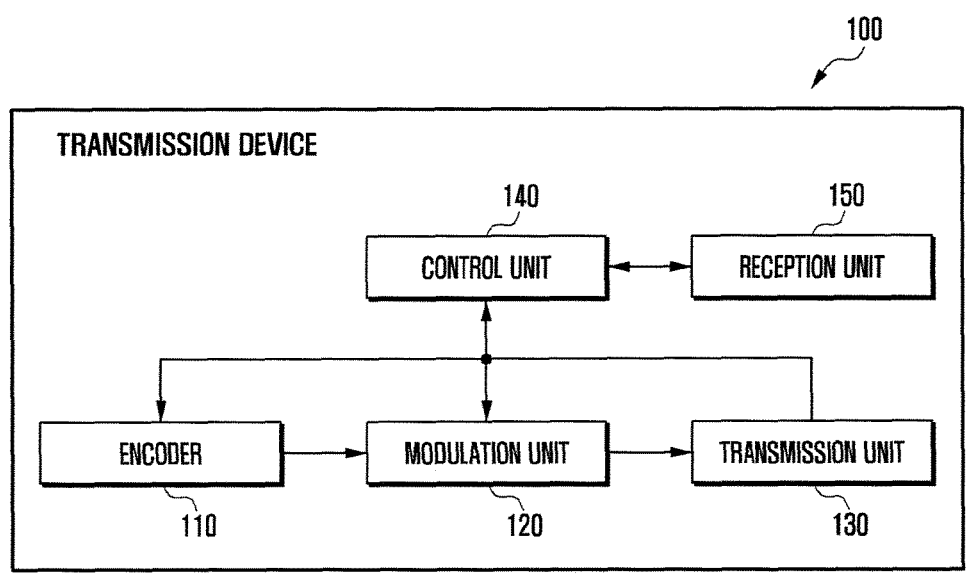
FIG. 1 is a block diagram illustrating the configuration of a transmission device according to a preferred embodiment of the present disclosure.

Hereinafter, preferred embodiments of the present disclosure will be described in detail with reference to the accompanying drawings. In describing the present disclosure, detailed description of well-known functions or configurations incorporated herein will be omitted if it is judged that such description unnecessarily obscures the subject matter of the present disclosure. This is to avoid obscuring the subject matter of the present disclosure and to transfer the same more accurately through omission of the unnecessary description.

For the same reason, in the accompanying drawings, some constituent elements are exaggerated, omitted, or roughly illustrated. Further, sizes of some constituent elements may not completely reflect the actual sizes thereof. In the drawings, the same drawing reference numerals are used for the same elements across various figures.

In describing embodiments of the present disclosure in detail, an LTE system and an LTE-Advanced (LTE-A) system will be exemplified. However, the main subject matter of the present disclosure can be applied to other communication systems adopting similar technology with slight modifications within a range that does not greatly deviate from the scope of the present disclosure, according to the judgment of a person skilled in the art to which the present disclosure pertains.

FIG. 1 is a block diagram illustrating the configuration of a transmission device according to a preferred embodiment of the present disclosure.

Referring to FIG. 1, a transmission device 100 according to the present disclosure may include an encoder 110, a modulation unit 120, a transmission unit 130, a control unit 140, and a reception unit 150.

The transmission device 100 according to the present disclosure may include at least one of a Base Station (BS) (or evolved Node B (eNB) or E-UTRAN Node B), a Relay Node (RN), and a terminal (or User Equipment (UE), Mobile Station (MS), or Subscriber Station (SS)).

The encoder 110 encodes data and generates a codeword. The encoder 110 may generate a codeword in a Bit-Interleaved Coded Modulation with Iterative Decoding (BICM-ID) method using a binary code. The BICM-ID method used in the present disclosure is composed of an outer code based on an irregular repetition code and an inner code based on a trellis code. The BICM-ID method shows a similar performance to the performance of a non-binary LDPC code, and has decoding complexity that is lower than the decoding complexity of the non-binary LDPC code. This method receives a message intended to be transmitted in the unit of a bit, and repeats all bits as many as a predetermined number of times. In this case, the number of repetitions for each bit may not be uniform. The encoder 110 optionally mixes repeated bit strings by making the repeated bit strings pass through an interleaver, and performs grouping thereof as many as the predetermined number of times. The encoder encodes the bit strings that come out as the result of the grouping using an inner encoder, and outputs a codeword to the modulation unit 120.

Unlike the structure of a general LDPC code, the BICM-ID structure has two check nodes connected to a symbol node. Accordingly, if non-punctured nodes are arranged around a punctured node, reliable messages can be directly obtained from both sides to cause fast convergence speed. After several iterations in iterative decoding, all the non-punctured nodes around the punctured nodes have messages of high reliability, and these punctured nodes contribute to the recovery of the messages in consecutive puncturing sections together with the non-punctured nodes.

The encoder 110 may insert doping information into the codeword. The doping information means information already known by both the sender and the receiver to succeed in decoding of the codeword. The doping information may include doping symbols. The doping symbol means a symbol value pre-engaged between the transmission device and the reception device and location information of the symbol value in the codeword that is generated by the transmission device. The encoder 110 inserts the doping symbols into the codeword.

The encoder 110 may puncture the codeword into which the doping symbols are inserted. The encoder 110 may puncture the codeword on the basis of the doping information included in the codeword, perform the puncturing so that lots of non-punctured nodes are arranged in front and in the rear of punctured nodes, and perform the puncturing so that the number of consecutively punctured nodes does not become too large.

The modulation unit 120 may modulate the codeword that is output by the encoder 110. The modulation unit 120 may be a FQAM modulator, and may modulate the codeword in a FQAM method to generate a modulation signal. The FQAM is a hybrid modulation method in which QAM and FSK are combined with each other, and has the characteristics to make an interference signal non-Gaussian in a similar manner to the FSK. Further, the FQAM simultaneously applies the QAM method, and thus greatly improves the spectral efficiency in comparison to the FSK method.

In order to obtain higher data throughput through application of the FQAM method, a channel code that suits the corresponding modulation method. As the existing QAM series modulation method, a binary turbo code based BICM method has been mainly used. However, in the case of using the above-described method in the FOAM method, it becomes impossible to obtain the performance that approaches a channel capacitor corresponding to a theoretical limit value. Accordingly, in order to solve this problem, a BICM-ID method based on a binary repetition code is used to obtain the performance that approaches the theoretical limit value.

As methods that can achieve the channel capacity when the FQAM modulation method is applied, there exist a Coded Modulation (CM) method using a non-binary LDPC code and a Bit-Interleaved Coded Modulation with Iterative Decoding (BICM-ID) method using a binary code. The BICM-ID method used in the present disclosure is composed of an outer code based on an irregular repetition code and an inner code based on a trellis code. This method shows a similar performance to the performance of a non-binary LDPC code, and has decoding complexity that is lower than the decoding complexity of the non-binary LDPC code. This method receives a message intended to be transmitted in the unit of a bit, and repeats all bits as many as a predetermined number of times. In this case, the number of repetitions for each bit may not be uniform. The repeated bit strings are optionally mixed through an interleaver, and are grouped as many as the predetermined number of times. The bit strings that come out as the result of the grouping are encoded using an inner encoder, and a modulation signal is obtained by inputting this codeword to a FQAM modulator.

The transmission unit 130 may transmit the codeword that is modulated by the modulation unit 120 to the reception device.

The control unit 140 executes a command and performs an operation related to the transmission device 100. For example, using the command, the control unit 140 may control input/output and data reception/processing between components of the transmission device 100. The control unit 140 may execute the command related to information received from the input device.

The control unit 140 executes a program code together with the operating system of the transmission device 100, and generates and uses data. The control unit 140 may control the operations of the encoder 110, the modulation unit 120, the transmission unit 130, and the reception unit 150. In a partial embodiment, the control unit 140 may perform the functions of the encoder 110 and the modulation unit 120. Since the operating system is generally known, the detailed description thereof will be omitted. For example, the operating system may be Window series OS, UNIX, Linux, Palm OS, DOS, Android, or Macintosh. The operating system, other computer codes, and data may exist in a storage device of the transmission device 100 that is connected to the control unit 140 to operate.

The control unit 140 may be implemented on a single chip, a plurality of chips, or a plurality of electrical components. For example, various architectures including a dedicated or embedded processor, a single purpose processor, a controller, an ASIC, or the like may be used for the control unit 140.

The control unit 140 may recognize a user action, and may control the transmission device 100 on the basis of the recognized user action. Here, the user action may include selection of a physical button of the transmission device, execution of a predetermined gesture or selection of a soft button on a touch screen display, execution of a predetermined gesture that is recognized from an image captured by an image capturing device, and execution of predetermined vocalization that is recognized through voice recognition. The gesture may include a touch gesture and a spatial gesture.

The reception unit 150 receives data from another transmission device. The data may include information on the result of measurement of the channel state. The control unit 140 may adjust the code rate of the codeword on the basis of the information, and may adjust a puncturing method. The reception unit 150 may receive a control signal from another transmission device through a wireless channel.

As a partial embodiment, the transmission device 100 may be connected to a base station or nodes (e.g., SGW and MME) on a core network through a wired interface (not illustrated) to transmit and receive a signal.

Figure 2:
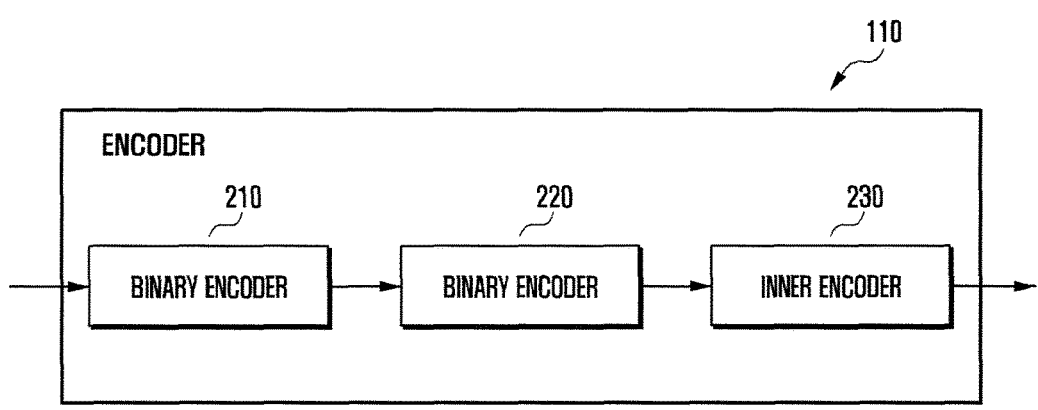
FIG. 2 is a block diagram illustrating the configuration of an encoder according to a preferred embodiment of the present disclosure.

FIG. 2 is a block diagram illustrating the configuration of an encoder according to a preferred embodiment of the present disclosure.

Referring to FIG. 2, an encoder 110 may include a binary encoder 210, an interleaver 220, and an inner encoder 230.

The binary encoder 210 encodes data (or a message) and generates a codeword. The binary encoder 210 may encode the data using a binary code. The binary encoder 210 may receive the data from the control unit 140 in the unit of a bit, and may generate the codeword through repetition of all bits as many as a predetermined number of times. Here, the number of repetitions for each bit may not be uniform. The codeword that is output from the binary encoder 210 may be a binary data stream.

The interleaver 220 interleaves the codeword that is generated by the binary encoder 210. The interleaver 220 may rearrange binary data streams output from the binary encoder 210, and may tie up a predetermined number of binary data streams into a group. Further, the interleaver 220 may output bit strings that are tied up into a group to the inner encoder 230.

The inner encoder 230 inserts doping symbols into the codeword that is output from the interleaver 220. Here, the codeword may be bit strings that are tied up into a group. The inner encoder 230 may insert the doping symbols into the codeword after encoding the codeword that is output from the interleaver 220.

The inner encoder 230 punctures the codeword into which the doping symbols are inserted, and outputs the punctured codeword to the modulation unit 120.

In order to perform the puncturing, the inner encoder 230 calculates the number of punctured symbol nodes among symbol nodes included in the codeword. As a partial embodiment, the inner encoder 230 may calculate the number of the punctured symbol nodes among the symbol nodes included in the codeword on the basis of the current code rate and a target code rate of the codeword.

The inner encoder 230 confirms whether the target code rate of the generated codeword is smaller than 2/3, and if the target code rate is smaller than 2/3, the inner encoder 230 punctures the symbol nodes included in the codeword so that the punctured nodes are uniformly arranged on the codeword. The target code rate may be a code rate of the codeword that is output to the modulation unit 120.

If the target code rate is not smaller than 2/3, the inner encoder 230 punctures symbol nodes located at even or odd number positions among symbol nodes included in the codeword. The symbol nodes to be punctured among the symbol nodes located at even or odd number positions may be determined on the basis of the locations of the doping symbols included in the codeword.

The inner encoder 230 calculates the number of symbol nodes which need to be additionally punctured on the basis of the calculated number of the symbol nodes to be punctured, and classifies the symbol nodes, which need to be additionally punctured, into one or more punctured node groups on the basis of the number of symbol nodes which need to be additionally punctured.

As a partial embodiment, the inner encoder 230 may classify the symbol nodes into one or more punctured node groups on the basis of at least one of the size and the number of symbol bands of the codeword. Here, the symbol band means a set of a predetermined number of consecutive code symbols including one doping symbol.

As a partial embodiment, the inner encoder 230 may classify the symbol nodes into one or more punctured node groups on the basis of at least one of the size and the number of symbol bands of the codeword and the size of the punctured node group determined according to a predetermined value. The sizes of at least two punctured node groups among the one or more punctured node groups may be equal to each other.

The inner encoder 230 determines the locations on the codeword where the one or more classified punctured node groups are to be arranged, and punctures the symbol nodes included in the codeword which belong to the punctured node groups according to the determined locations. As a partial embodiment, each of the one or more punctured node groups may be arranged in the center of the symbol band of the codeword.

Further, a plurality of punctured node groups may be arranged on at least one of the symbol bands of the codeword. The number of punctured node groups arranged on the symbol band may be determined on the basis of at least one of the doping symbol and the target code rate of the codeword, and the number of punctured node groups arranged on at least one of the symbol bands of the codeword may be different from the number of punctured node groups arranged on another symbol band.

As a partial embodiment, for conversion of a first target code rate into a second target code rate, the inner encoder 230 may calculate the number of punctured nodes to be unpunctured in the codeword punctured at the first target code rate and may unpuncture the punctured nodes in the codeword according to the calculated number of punctured nodes. Here, the punctured nodes that belong to the punctured node group may be first unpunctured. The first target code rate and the second target code rate may be different from each other, and the second target code rate may be higher than the first target code rate.

As a partial embodiment, the encoder 110 may further include a puncturing unit, and the puncturing unit may puncture the codeword into which the doping symbols are inserted in place of the inner encoder 230.

Figure 3:
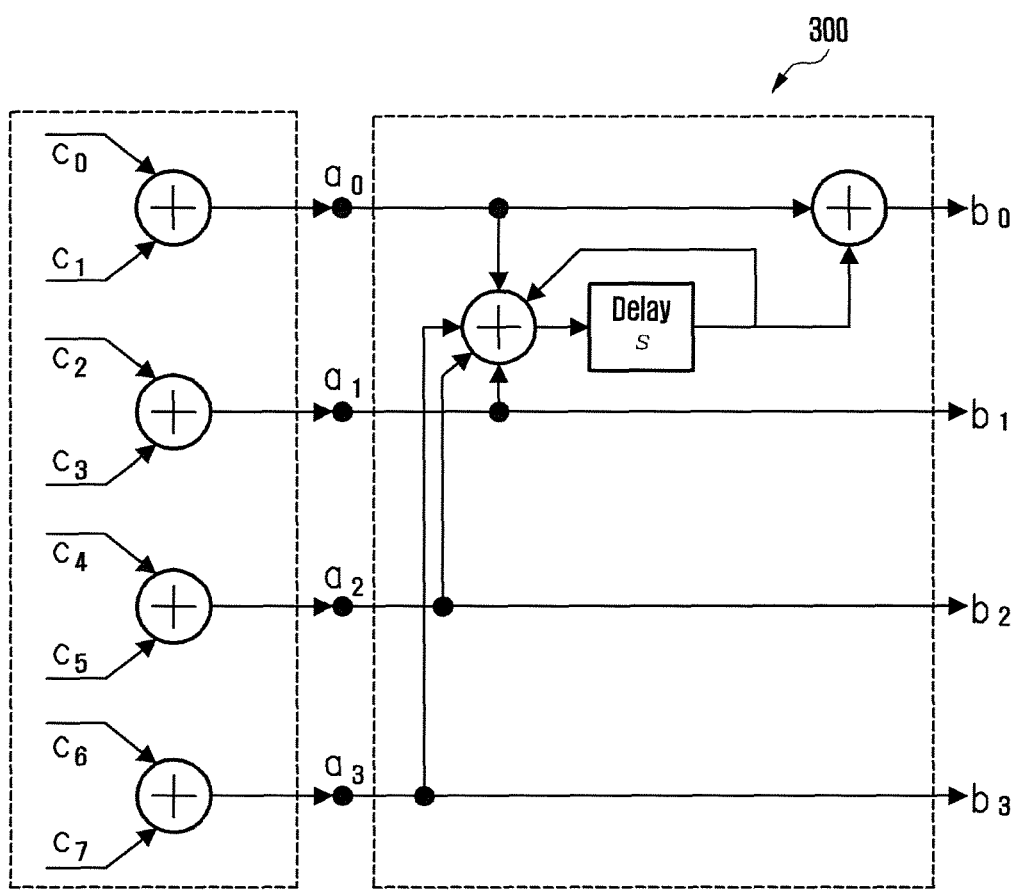
FIG. 3 is a diagram illustrating the structure of an internal encoder according to a preferred embodiment of the present disclosure.

FIG. 3 is a diagram illustrating the structure of an internal encoder according to a preferred embodiment of the present disclosure.

Referring to FIG. 3, the structural diagram 300 shows the structure of an inner encoder 230 according to an embodiment. The inner encoder 230 may encode a codeword (C0, C1, C2, C3, C4, C5, C6, C7) output from the interleaver 220 to a codeword (b0, b1, b2, b3). The inner encoder 230 generates $\alpha 0$ on the basis of symbols C0 and C1, generates $\alpha 1$ on the basis of symbols C2 and C3, generates $\alpha 2$ on the basis of symbols C4 and C5, and generates $\alpha 3$ on the basis of symbols C6 and C7. Symbol b0 may be generated on the basis of the symbol $\alpha 0$ and a delay S, and the delay S may delay the symbols generated on the basis of $\alpha 0$, $\alpha 1$, $\alpha 2$, and $\alpha 3$. Symbols b1, b2, and b3 may be generated from $\alpha 1$, $\alpha 2$, and $\alpha 3$.

Figure 4:
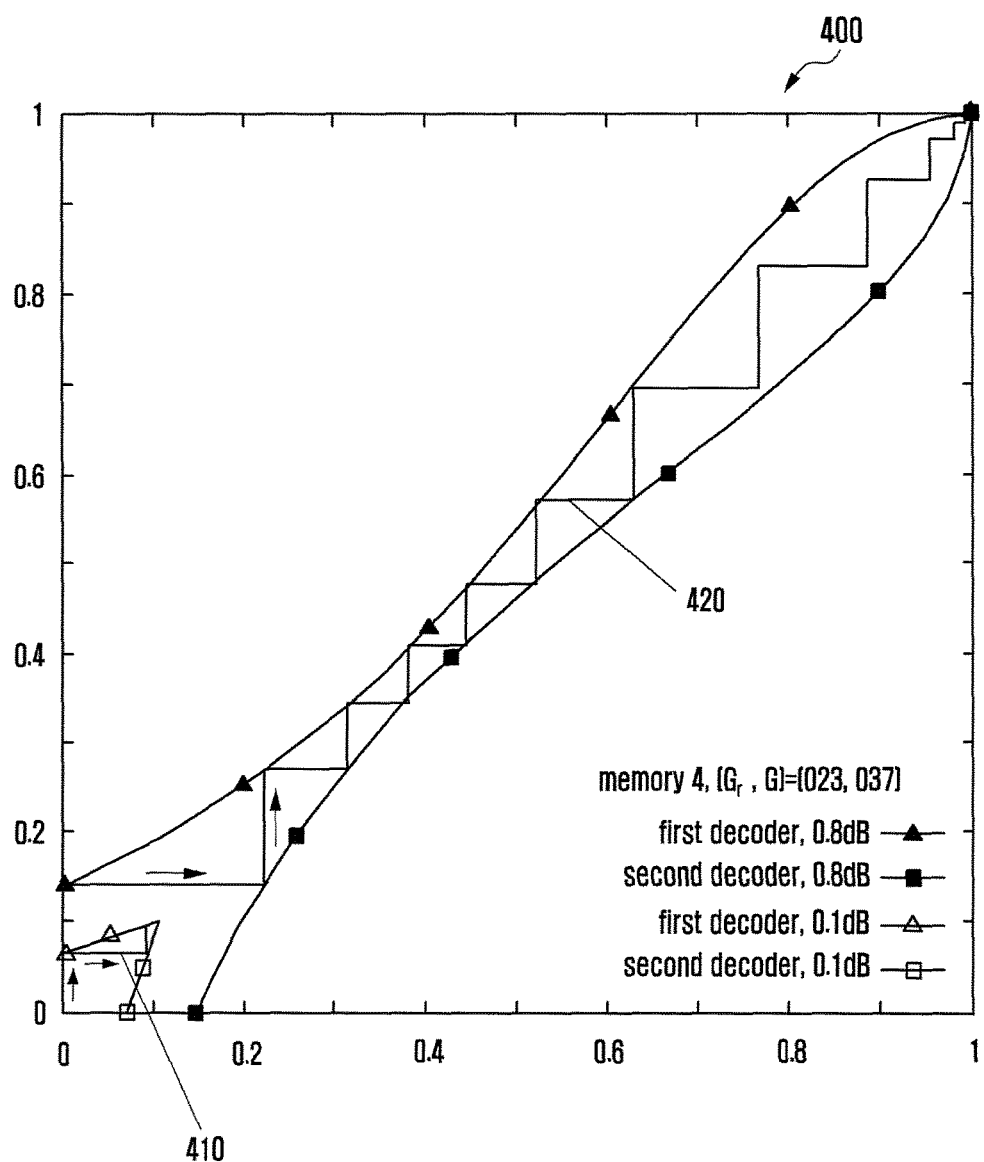
FIG. 4 is a graph illustrating a decoding trajectory.

FIG. 4 is a graph illustrating a decoding trajectory.

Referring to FIG. 4, in the graph 400, a decoding trajectory 410 indicates a trajectory of iterative decoding at 0.1 dB. The decoding trajectory 410 indicates that decoding is not performed over 0.2.

A decoding trajectory 420 indicates a trajectory of iterative decoding at 0.8 dB. The decoding trajectory 420 indicates a process in which decoding is gradually increased to be completed between a first decoder and a second decoder.

As can be known from the decoding trajectories 410 and 420, the decoding may fail at a specific dB or less.

Figure 5:
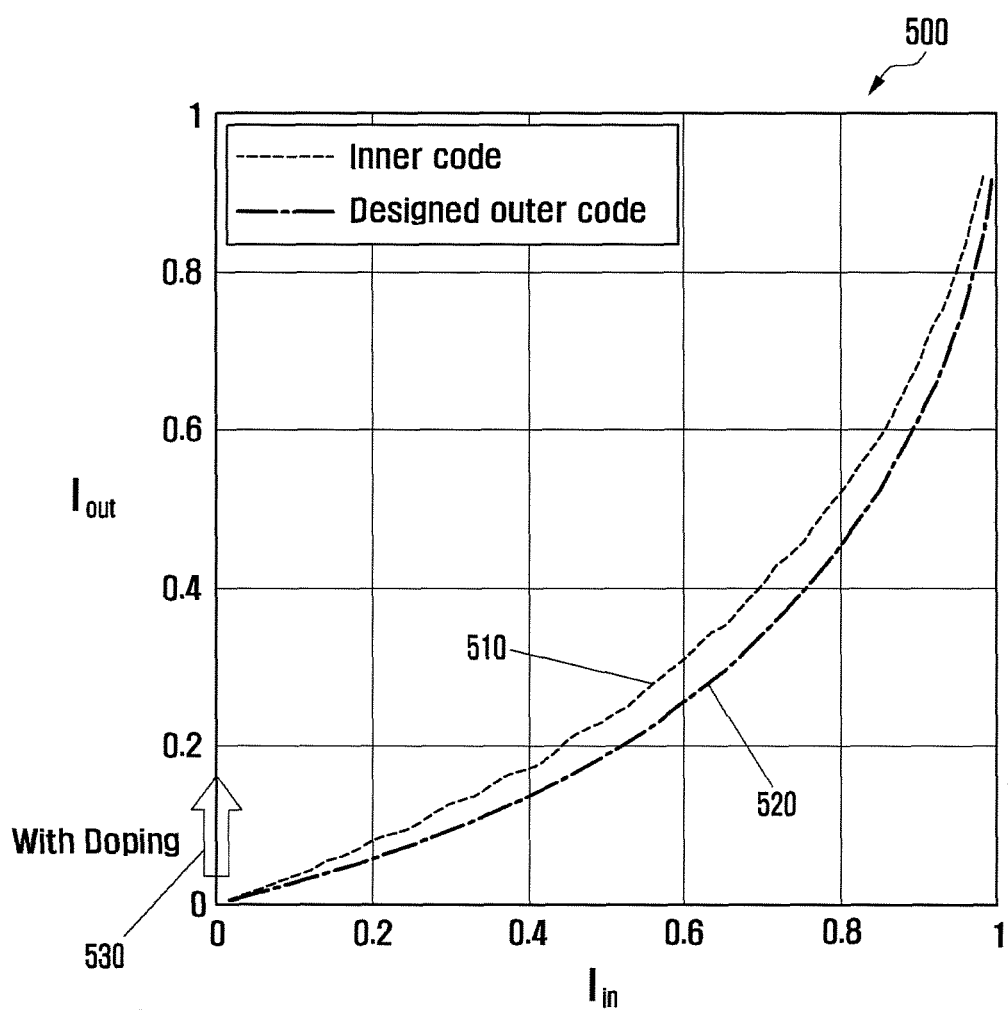
FIG. 5 is a graph explaining the function of a doping symbol.

FIG. 5 is a graph explaining the function of a doping symbol.

Referring to FIG. 5, the doping symbol may be inserted into the codeword by the inner encoder 230, and may be inserted into a pre-engaged location between the transmission device and the reception device. The doping symbol may be used as information that helps a decoder according to the present disclosure to operate.

In the graph 500, a line 510 indicates a decoding trajectory of an inner code, and a line 520 indicates a decoding trajectory of a designed outer code. The doping symbol serves to heighten a start point of the decoding as high as the size 530 thereof. Accordingly, the transmission device and the reception device according to the present disclosure can prevent the iterative decoding from failing using the doping symbol.

The inner decoder 230 may determine the rate of the doping symbol to be inserted into the codeword according to the length of the codeword. As an example, the inner encoder 230 may determine the rate of the doping symbol at the rate in the range of 1% to 5% of the whole codeword.

Figure 6:
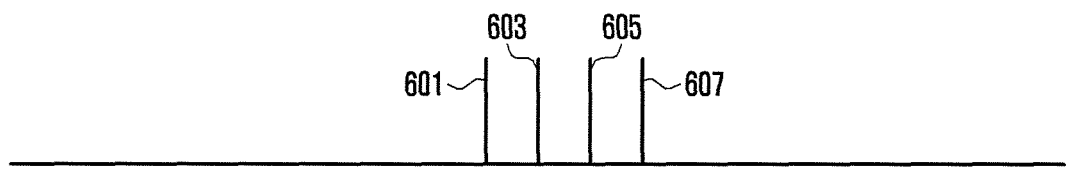
FIG. 6 is a diagram illustrating an arrangement of a doping symbol according to a preferred embodiment.

FIG. 6 is a diagram illustrating an arrangement of a doping symbol according to a preferred embodiment.

Referring to FIG. 6, point 601, point 603, point 605, and point 607 indicate locations in the codeword into which doping symbols are inserted. As illustrated in FIG. 6, the inner encoder 230 may concentratedly arrange the doping symbols in a specific section of the code.

Figure 7:
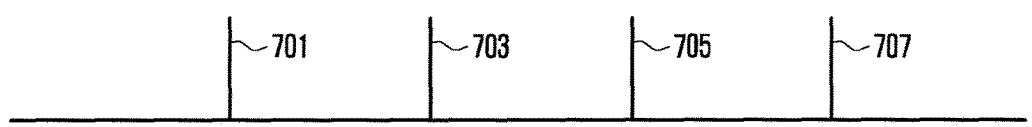
FIG. 7 is a diagram illustrating an arrangement of a doping symbol according to another preferred embodiment.

FIG. 7 is a diagram illustrating an arrangement of a doping symbol according to another preferred embodiment.

Referring to FIG. 7, point 701, point 703, point 705, and point 707 indicate locations in the codeword into which doping symbols are inserted. As illustrated in FIG. 7, the inner encoder 230 may dispersedly arrange the doping symbols in a specific section of the code.

Figure 8:
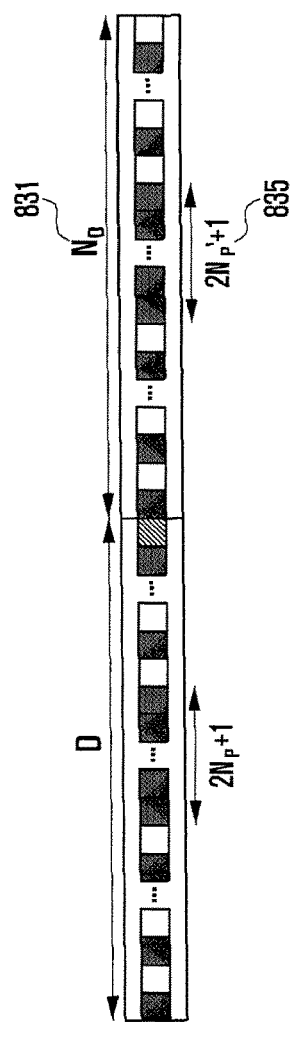
FIG. 8 is a diagram explaining a method for puncturing a codeword according to an embodiment of the present disclosure.
Figure 8:
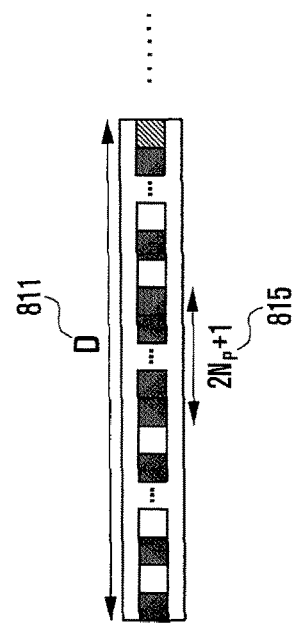

FIG. 8 is a diagram explaining a method for puncturing a codeword according to an embodiment of the present disclosure.

Referring to FIG. 8, in the case of encoding a codeword having the current code rate of 1/3 at a target code rate r(=1/R, R≥2/3), an index i of the symbol node of the codeword is defined as in mathematical expression 1 below, and it is assumed that it starts from 0.

$$i = sD + j \quad \text{[Mathematical Expression 1]}$$

The inner encoder 230 punctures the symbol node if the index i of the symbol node satisfies the following basic puncturing condition.

$$j = 2k, k = 0, 1, \ldots, D/2-1 \quad \text{if} \quad s \leq N_D - 1 \text{ and}$$
$$k = 0, \ldots, \lfloor N_D/2 \rfloor - 1 \text{ if } s = N_D \quad \text{(Basic puncturing condition)}$$

Here, D denotes the number of symbols included in a symbol band 811, and $N_D$ denotes the number of symbols of the last symbol band 831. The last symbol band does not include the doping symbol.

The inner encoder 230 punctures the symbol node if the index i of the symbol node satisfies the following additional puncturing condition 1.

$$sD + \eta \leq i \leq sD + \eta + 2(N_p - 1), s \in T_p$$

$$sD + \eta \leq i \leq sD + \eta + 2(N_p' - 1), s \in T_p' \quad \text{(Additional puncturing condition 1)}$$

Here, η is an odd number that satisfies $1 \leq \eta \leq D - 2N_p' - 1$, and the above expressions are established with respect to all s.

$N_p$ is defined as in mathematical expression 2 below.

$$N_P = \left\lfloor \left(\frac{1}{2} - \frac{R}{3}\right)\frac{N}{N_D} + \frac{1}{2} \right\rfloor \quad \text{[Mathematical Expression 2]}$$

$N_p'$ is defined as in mathematical expression 3 below.

$$N_p' = N_p + 1 \quad \text{[Mathematical Expression 3]}$$

$T_p$ and $T_p'$ are disjoint lower sets of an index set {0, 1, ..., $N_D$} that satisfies mathematical expression 4 below.

$$N_p \cdot |T_p| + N_p' \cdot |T_p'| = \left(\frac{1}{2} - \frac{R}{3}\right)N + \frac{N_D}{2} \quad \text{[Mathematical Expression 4]}$$

Further, if $N_D \leq D$, it is assumed that $N_D \in T_p$, and if $N_D > D$, it is assumed that $N_D \in T_p'$.

As an embodiment, a case where a code having a code rate of 10/31 is punctured to 5/6 will be described hereinafter. The inner decoder 230 first punctures symbol nodes one after another. For convenience, the inner decoder 230 punctures all odd-numbered symbol nodes. Even through such puncturing, the code rate becomes 20/31, and thus a desired code rate is unable to be obtained. In this case, in order to obtain a desired code rate, the punctured symbol nodes are consecutively arranged as in consecutive puncturing sections 815 and 835. Here, the punctured node group may be located in the consecutive puncturing sections 815 and 835.

In the case of the code rate of 5/6, it is proper that the size of the consecutive puncturing sections corresponds to about 13 sections. The inner encoder 230 may set the consecutive puncturing sections so that a large number of doping symbols are not punctured in full consideration of the locations of the doping symbols. If a puncturing pattern is obtained as described above, a stepping puncturing section in which symbol nodes are punctured one after another and a consecutive puncturing section in which several symbol nodes are consecutively punctured appear repeatedly.

The method for puncturing a codeword as illustrated in FIG. 8 has the following advantages. According to the puncturing using the existing kSR concept, performance deterioration appears remarkably at a high code rate. However, if the puncturing pattern is designed in the method for puncturing a codeword as illustrated in FIG. 8, a code that suits the corresponding code rate can be designed. Further, according to the method for puncturing a codeword as illustrated in FIG. 8, a rate-compatible structure that supports various code rates can be designed more easily. In detail, a puncturing pattern that suits a high code rate (first target code rate) is first designed. Further, in the case of intending to obtain a pattern having a code rate (second target code rate) that is lower than the first target code rate, nodes located at even number positions among nodes that belong to the consecutive puncturing sections (punctured node group) are punctured in turn until a desired code rate is obtained. In this case, better performance can be obtained by making unpunctured nodes uniformly distributed in the whole consecutive puncturing sections if possible. The code designed as described above does not show great performance deterioration in comparison to the puncturing pattern that is optimal at the second target code rate.

Figure 9:
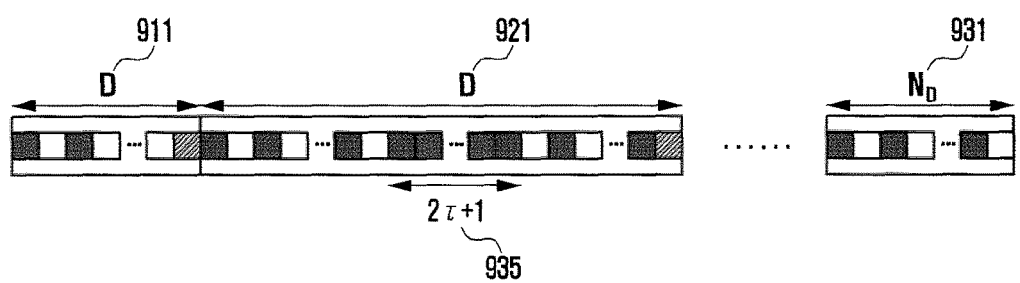
FIG. 9 is a diagram explaining a method for puncturing a codeword according to another embodiment of the present disclosure.

FIG. 9 is a diagram explaining a method for puncturing a codeword according to another embodiment of the present disclosure.

Referring to FIG. 9, in the case of encoding a codeword having the current code rate of 1/3 at a target code rate r(=1/R, r≥2/3), an index i of the symbol node of the codeword is defined as in mathematical expression 1 as described above, and it is assumed that it starts from 0.

The inner encoder 230 punctures the above-described symbol node if the index i of the symbol node satisfies the basic puncturing condition.

The inner encoder 230 punctures the symbol node if the index i of the symbol node satisfies the following additional puncturing conditions 2 to 4.

If the following additional puncturing condition 2 is satisfied with respect to the index i of the symbol node that satisfies $v_s = 1$ in the case where $v_s \leq 1$ is given with respect to all s, the inner encoder 230 punctures the above-described symbol node.

$$sD + \eta \leq i \leq sD + \eta + 2(\tau - 1) \quad \text{(Additional puncturing condition 2)}$$

Here, η is an odd number that satisfies $1 \leq \eta \leq D - 2N_p' - 1$.

If the following additional puncturing condition 3 is satisfied with respect to the index i of the symbol node that satisfies $v_s = 1$ in the case where $v_s \geq 1$ is given with respect to all s, the inner encoder 230 punctures the above-described symbol node.

$$sD + \eta_1 \leq i \leq sD + \eta_1 + 2(\tau - 1) \quad \text{(Additional puncturing condition 3)}$$

Further, if the following condition is satisfied with respect to the index i of the symbol node that satisfies the following additional puncturing condition 4 in the case where $v_s>1$ is given with respect to all s, the inner encoder 230 punctures the above-described symbol node.

$$sD+\eta_k \leq i \leq sD+\eta_k+2(\tau-1) \quad \text{(Additional puncturing condition 4)}$$

Here, k denotes an integer in the range of 1 to $v_s$, and indicates $\eta_{k+1}-\eta_k=\lfloor D/v_s \rfloor-(2\tau+1)$, $\eta_0=0$. Further, $v_s$ is defined as in the following mathematical expression 5.

$$v_s=\lfloor s \cdot \bar{v}_p \rfloor - \lfloor (s-1) \cdot \bar{v}_p \rfloor \quad \text{[Mathematical Expression 5]}$$

$\bar{v}_p$ is defined as in the following mathematical expression 6.

$$\bar{v}_p=(v_p-v_{N_D})/N_D \quad \text{[Mathematical Expression 6]}$$

$v_p$ is defined as in the following mathematical expression 7.

$$v_p = \left\lfloor \frac{1}{\tau} \cdot \left( \left(1-\frac{R}{3}\right)N + N_D \right) \right\rfloor \quad \text{[Mathematical Expression 7]}$$

Here, $\tau$ means a figure that makes the number of consecutive punctured symbol nodes become $2\tau+1$.

$v_{N_D}$ is defined as follows.

If $v_p \geq N_D$, and $N_D>2D$, it is defined that $v_{N_D}=2$.
If $v_p \geq N_D$, and $D<N_D \leq 2D$, it is defined that $v_{N_D}=1$.
If $v_p \geq N_D$, and $N_D \leq D$, it is defined that $v_{N_D}=0$.
If $v_p < N_D$, and $N_D>2D$, it is defined that $v_{N_D}=1$.
If $v_p < N_D$, and $N_D \leq 2D$, it is defined that $v_{N_D}=0$.

Here, if the number of doping symbols is set to 1% to 5% of the code symbol, $v_s$ does not typically exceed 2. In most cases, $v_s$ becomes 1 or 0.

A punctured node group 921 is arranged on symbol bands. According to the additional puncturing condition 2, a plurality of punctured node groups may be arranged on the symbol bands 911 and 921. The number of punctured node groups arranged on the symbol band 911 may be different from the number of punctured node groups arranged on the symbol band 921. In the case where the number of doping symbols is small and the code rate is high, a plurality of punctured node groups may be arranged on one symbol band.

If the $N_D$ value is large, the punctured node group may be arranged even on the last symbol band 931.

Figure 10:
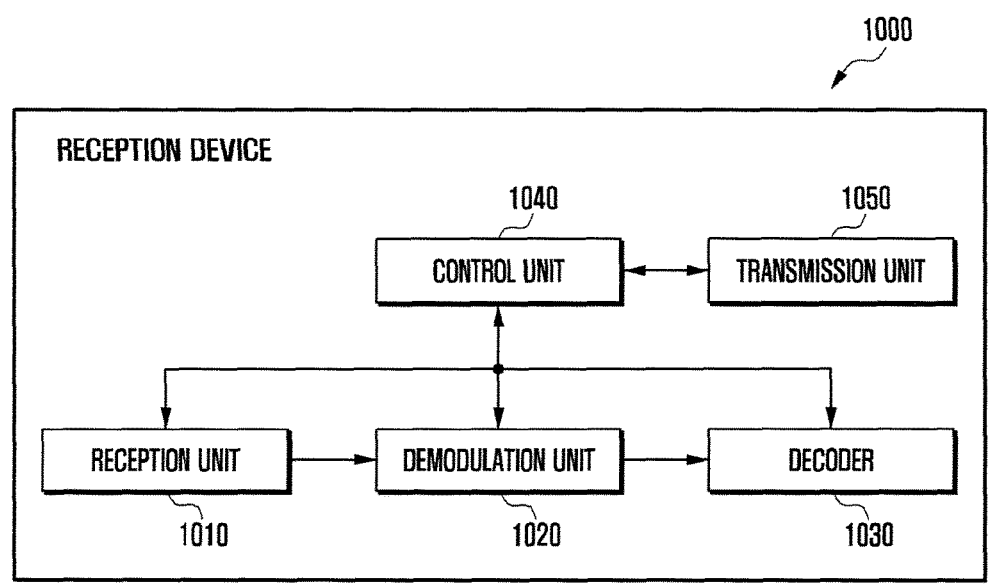
FIG. 10 is a block diagram illustrating the configuration of a reception device according to a preferred embodiment of the present disclosure.

FIG. 10 is a block diagram illustrating the configuration of a reception device according to a preferred embodiment of the present disclosure.

Referring to FIG. 10, a reception device 1000 according to the present disclosure may include a reception unit 1010, a demodulation unit 1020, a decoder 1030, a control unit 1040, and a transmission unit 1050.

The reception device may include at least one of a Base Station (BS) (or evolved Node B (eNB) or E-UTRAN Node B), a Relay Node (RN), and a terminal (or User Equipment (UE) or Mobile Station (MS) or Subscriber Station (SS)).

As a partial embodiment, the transmission device 100 of FIG. 1 and the reception device 1000 may be implemented as one device.

The reception unit 1010 receives a codeword from the transmission device 100. The codeword may include a control signal and data. The received codeword may be generated by puncturing symbol nodes located at even or odd number positions among symbol nodes included in the codeword, classifying the symbol nodes, which need to be additionally punctured, into one or more punctured node groups, and puncturing the symbol nodes which belong to the punctured node groups according to the locations on the codeword where the one or more punctured node groups are arranged.

The demodulation unit 1020 demodulates the codeword received by the reception unit 1010.

The decoder 1030 decodes the codeword demodulated by the demodulation unit 1020. The decoder 1030 may decode the codeword using doping symbols included in the codeword. As an example, the doping symbol may be used as information that helps an iterative decoder to operate. Here, the iterative decoder may be an iterative decoder of an IRPA code.

The control unit 1040 executes a command and performs an operation related to the reception device 1000. For example, using the command, the control unit 1040 may control input/output and data reception/processing between components of the reception device 1000. The control unit 1040 may execute the command related to information received from the input device.

The control unit 1040 executes a program code together with the operating system of the reception device 1000, and generates and uses data. The control unit 1040 may control the operations of the reception unit 1010, the demodulation unit 1020, the decoder 1030, and the transmission unit 1050. In a partial embodiment, the control unit 1040 may perform the functions of the demodulation unit 1020 and the decoder 1030. Since the operating system is generally known, the detailed description thereof will be omitted. For example, the operating system may be Window series OS, UNIX, Linux, Palm OS, DOS, Android, or Macintosh. The operating system, other computer codes, and data may exist in a storage device of the reception device 1000 that is connected to the control unit 1040 to operate.

The control unit 1040 may be implemented on a single chip, a plurality of chips, or a plurality of electrical components. For example, various architectures including a dedicated or embedded processor, a single purpose processor, a controller, an ASIC, or the like may be used for the control unit 1040.

The control unit 1040 may recognize a user action, and may control the reception device 1000 on the basis of the recognized user action. Here, the user action may include selection of a physical button of the reception device, execution of a predetermined gesture or selection of a soft button on a touch screen display, execution of a predetermined gesture that is recognized from an image captured by an image capturing device, and execution of predetermined vocalization that is recognized through voice recognition. The gesture may include a touch gesture and a spatial gesture.

The transmission unit 1050 transmits data to another reception device. Here, the data may include at least one of a control signal, data, and information related to measurement report. The information related to the measurement report may include information on the result of measurement of the channel state. The data may be encoded to the codeword to be transmitted.

Figure 11:
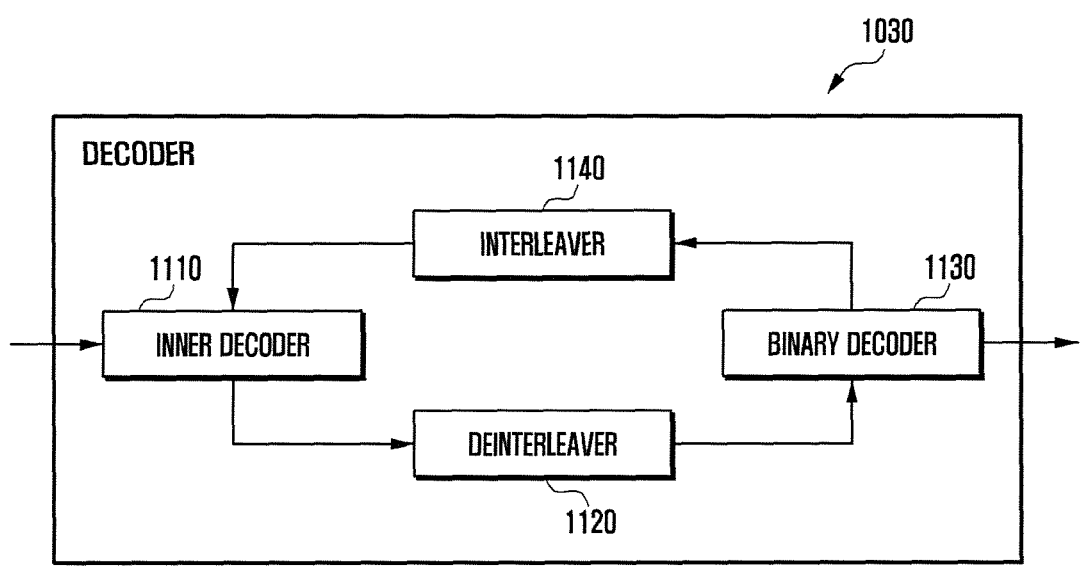
FIG. 11 is a block diagram illustrating the configuration of a decoder according to a preferred embodiment of the present disclosure.

FIG. 11 is a block diagram illustrating the configuration of a decoder according to a preferred embodiment of the present disclosure.

Referring to FIG. 11, a decoder 1030 may include an inner decoder 1110, a deinterleaver 1120, a binary decoder 1130, and an interleaver 1140.

The inner decoder 1110 may perform decoding using a reception channel LLR value that is calculated by the demodulation unit 1020 using a BCJR algorithm using forward/backward recursion and a probability value of the codeword that is output from the interleaver 1140. The inner decoder 1110 may use message values of the (j−1)-th and (j+1)-th symbol nodes when decoding the i-th symbol node. That is, the symbol node included in the codeword may be decoded using the message values of symbol nodes in front and in the rear of the symbol node. According to the codeword that is generated by the method for puncturing a codeword according to the present disclosure, non-punctured nodes are arranged in front and in the rear of the punctured nodes during decoding, and the corresponding nodes receive messages of high reliability from both sides thereof during the decoding.

The deinterleaver 1120 deinterleaves the codeword decoded by the inner decoder 1110.

The binary decoder 1130 decodes the codeword that is deinterleaved by the deinterleaver 1120 and generates data. The binary decoder 1130 outputs the codeword to the interleaver 1140.

The interleaver 1140 interleaves the codeword that is output from the binary decoder 1130, and outputs the interleaved codeword to the inner decoder 1110. Here, the interleaver 1140 may be the same as the interleaver 220 located inside the encoder 110. Accordingly, the decoder 1030 according to the present disclosure generates data by iteratively decoding the codeword through the inner decoder 1110, the deinterleaver 1120, the binary decoder 1130, and the interleaver 1140.

Figure 12:
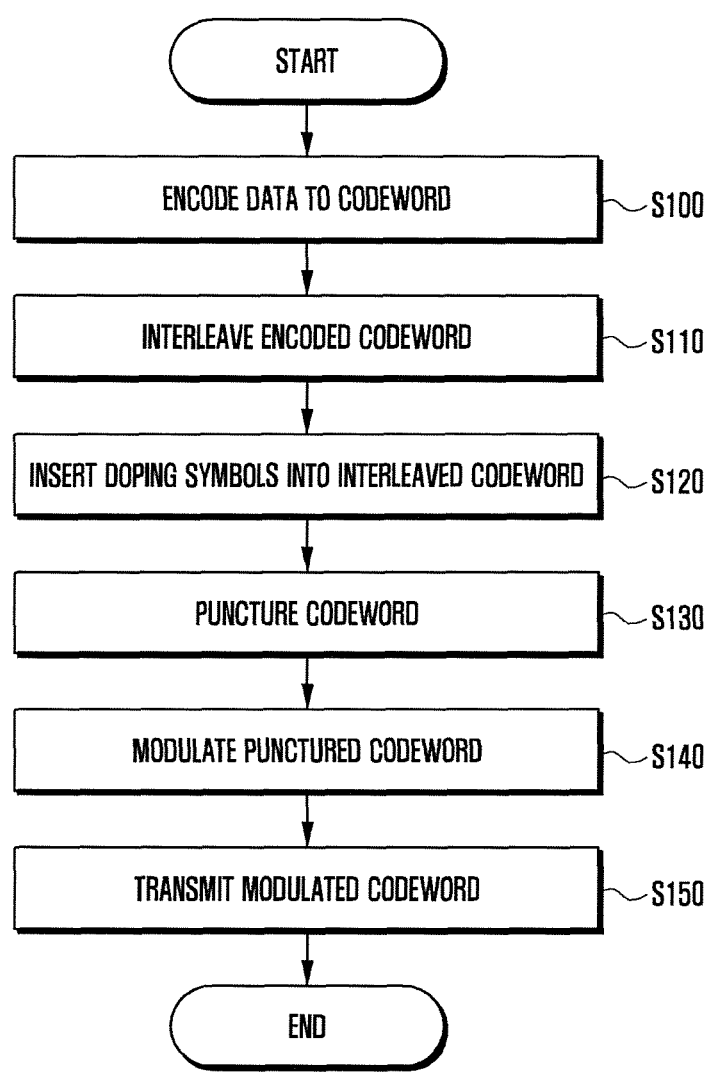
FIG. 12 is a flowchart illustrating performing processes of a method for generating a codeword according to a preferred embodiment of the present disclosure.

FIG. 12 is a flowchart illustrating performing processes of a method for generating a codeword according to a preferred embodiment of the present disclosure.

Referring to FIG. 12, the binary encoder 210 encodes data to a codeword (S100). The binary encoder 210 may encode the data using a binary code. The binary encoder 210 may receive the data from the control unit 140 in the unit of a bit, and may generate the codeword through repetition of all bits as many as a predetermined number of times. Here, the number of repetitions for each bit may not be uniform. The codeword that is output from the binary encoder 210 may be a binary data stream. The binary code may be an IR code.

The interleaver 220 interleaves the codeword that is encoded by the binary encoder 210 (S110). The interleaver 220 may rearrange binary data streams output from the binary encoder 210, and may tie up a predetermined number of binary data streams into a group. Further, the interleaver 220 may output bit strings that are tied up into a group to the inner encoder 230.

The inner encoder 230 inserts doping symbols into the codeword that is interleaved by the interleaver 220 (S120).

The inner encoder 230 punctures the codeword into which the doping symbols are inserted (S130).

The modulation unit 120 modulates the punctured codeword (S140).

The transmission unit 130 transmits the codeword that is modulated by the modulation unit 120 (S150).

Figure 13:
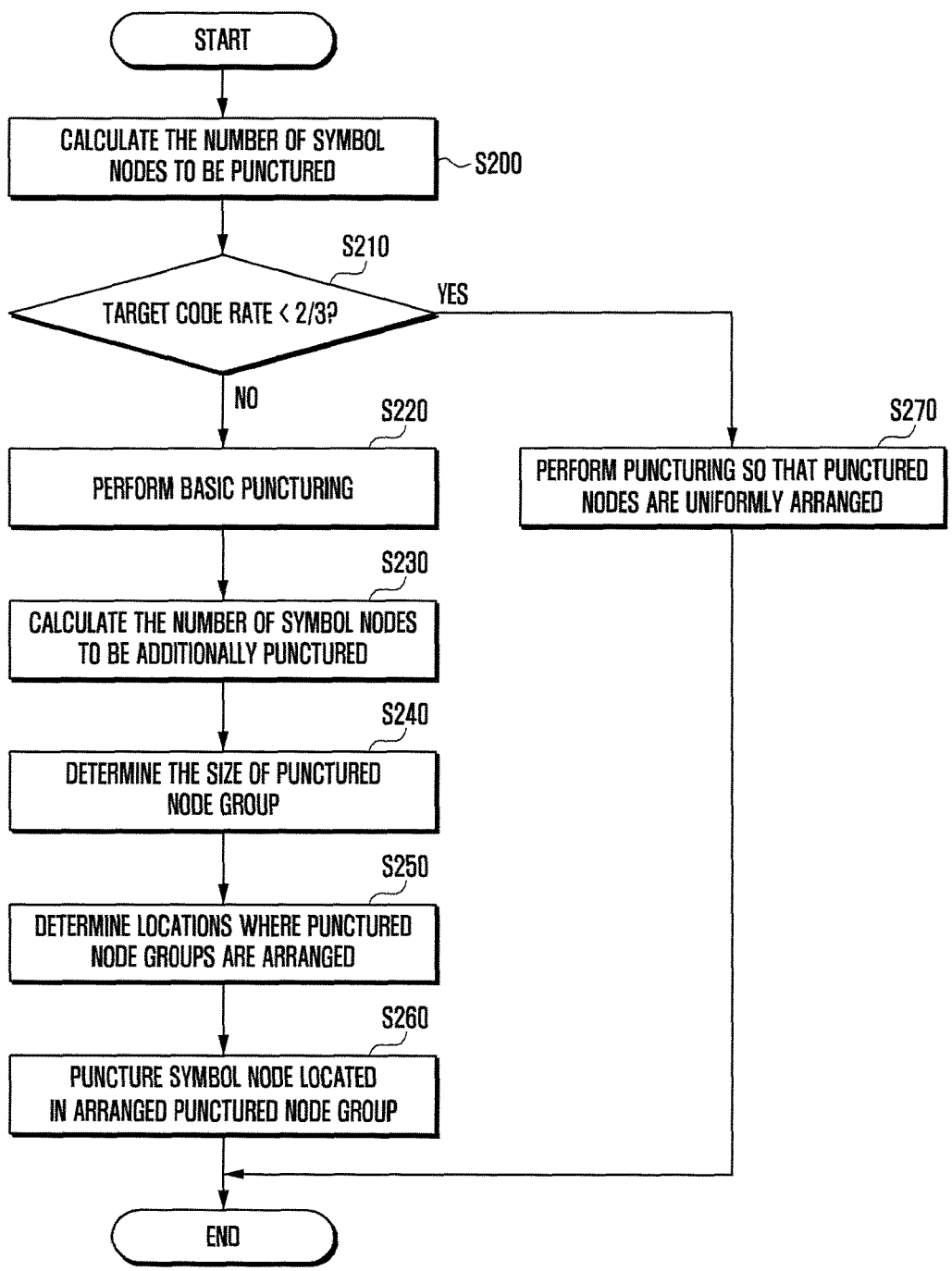
FIG. 13 is a flowchart illustrating performing processes of a method for puncturing a codeword according to a preferred embodiment of the present disclosure.

FIG. 13 is a flowchart illustrating performing processes of a method for generating a codeword according to a preferred embodiment of the present disclosure.

Referring to FIG. 13, the inner encoder 110 calculates the number of punctured symbol nodes from the codeword (S200). Here, the codeword may be a codeword that is output by the binary encoder 210 or the interleaver 220.

The inner encoder 110 confirms whether the target code rate is smaller than 2/3 (S210).

If the target code rate is not smaller than 2/3, the inner encoder 230 performs basic puncturing (S220). Here, the inner encoder 230 punctures symbol nodes located at even or odd number positions among symbol nodes included in the codeword. The symbol nodes to be punctured among the symbol nodes located at even or odd number positions may be determined on the basis of the locations of the doping symbols included in the codeword.

The inner encoder 230 calculates the number of symbol nodes which need to be additionally punctured on the basis of the calculated number of the symbol nodes to be punctured (S230).

The inner encoder 230 determines the size of the punctured node group (S240). Here, the inner encoder 230 may determine the size of the punctured node group on the basis of the number of symbol nodes which need to be punctured, and may classify the symbol nodes, which need to be additionally punctured, into one or more punctured node groups according to the determined size. As a partial embodiment, the inner encoder 230 may determine the size of the punctured node group on the basis of at least one of the size and the number of symbol bands of the codeword. Here, the symbol band means a set of a predetermined number of consecutive code symbols including one doping symbol. As a partial embodiment, the inner encoder 230 may classify the symbol nodes into one or more punctured node groups on the basis of at least one of the size and the number of symbol bands of the codeword and the size of the punctured node group determined according to a predetermined value. The sizes of at least two punctured node groups among the one or more punctured node groups may be equal to each other.

The inner encoder 230 determines the locations on the codeword where the one or more classified punctured node groups are to be arranged (S250). As a partial embodiment, each of the one or more punctured node groups may be arranged in the center of the symbol band of the codeword. Further, a plurality of punctured node groups may be arranged on at least one of the symbol bands of the codeword. The number of punctured node groups arranged on the symbol band may be determined on the basis of at least one of the doping symbol and the target code rate of the codeword, and the number of punctured node groups arranged on at least one of the symbol bands of the codeword may be different from the number of punctured node groups arranged on another symbol band.

The inner encoder 230 punctures the symbol nodes included in the codeword that belong to the punctured node groups according to the determined locations (S260).

If the target code rate is smaller than 2/3, the inner encoder 110 punctures the symbol nodes included in the codeword so that the punctured nodes are uniformly arranged on the codeword (S270). The target code rate may be a code rate of the codeword that is output to the modulation unit 120.

As a partial embodiment, operation S130 of FIG. 12 may include operations S200 to S260.

Figure 14:
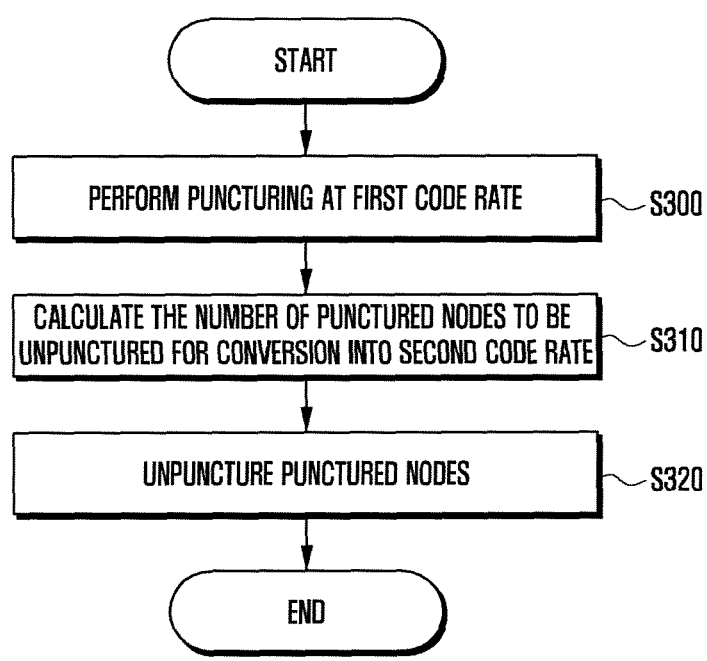
FIG. 14 is a flowchart illustrating performing processes of a method for generating a codeword according to another preferred embodiment of the present disclosure.

FIG. 14 is a flowchart illustrating performing processes of a method for generating a codeword according to another preferred embodiment of the present disclosure.

Referring to FIG. 14, the inner encoder 230 punctures the codeword at a first target code rate (S300). Operation S300 may include operations S200 to S260 of FIG. 13.

For conversion into a second target code rate, the inner encoder 230 calculates the number of punctured nodes to be unpunctured in the codeword punctured at the first target code rate (S310). The first target code rate and the second target code rate may be different from each other, and the second target code rate may be higher than the first target code rate.

The inner encoder 230 unpunctures the punctured nodes in the codeword according to the calculated number of punctured nodes (S320). Here, the punctured nodes that belong to the punctured node group may be first unpunctured.

As a partial embodiment, operation S130 of FIG. 12 may include operations S300 to S320 of FIG. 13.

Figure 15:
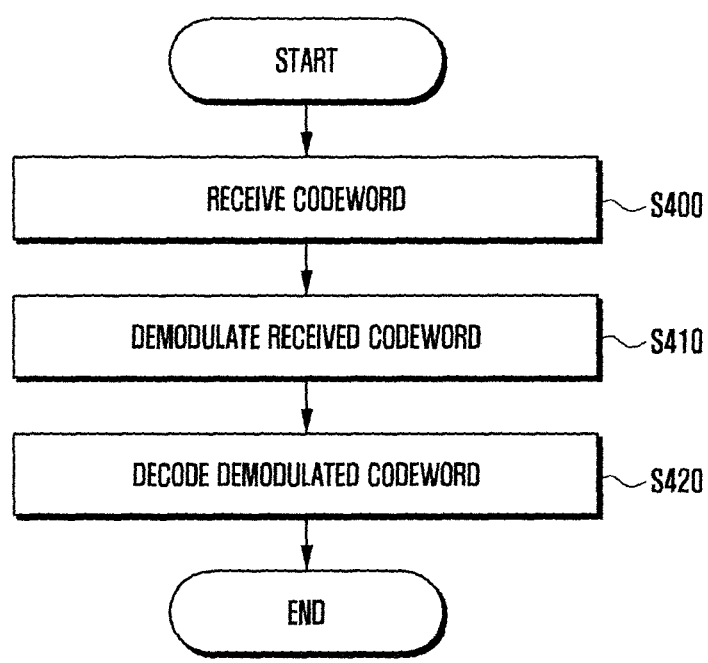
FIG. 15 is a flowchart illustrating performing processes of a method for decoding a codeword according to a preferred embodiment of the present disclosure.

FIG. 15 is a flowchart illustrating performing processes of a method for decoding a codeword according to a preferred embodiment of the present disclosure.

Referring to FIG. 15, the reception unit 1010 receives the codeword from the transmission device 100 (S400). The codeword may include a control signal and data. The received codeword may be generated by puncturing symbol nodes located at even or odd number positions among symbol nodes included in the codeword, classifying the symbol nodes, which need to be additionally punctured, into one or more punctured node groups, and puncturing the symbol nodes which belong to the punctured node groups according to the locations on the codeword where the one or more punctured node groups are arranged.

The demodulation unit 1020 demodulates the codeword received by the reception unit 1010 (S410).

The decoder 1030 decodes the codeword demodulated by the demodulation unit 1020 (S420). The decoder 1030 may decode the codeword using doping symbols included in the codeword. As an example, the doping symbol may be used as information that helps an iterative decoder to operate. Here, the iterative decoder may be an iterative decoder of an IRPA code.

Figure 16:
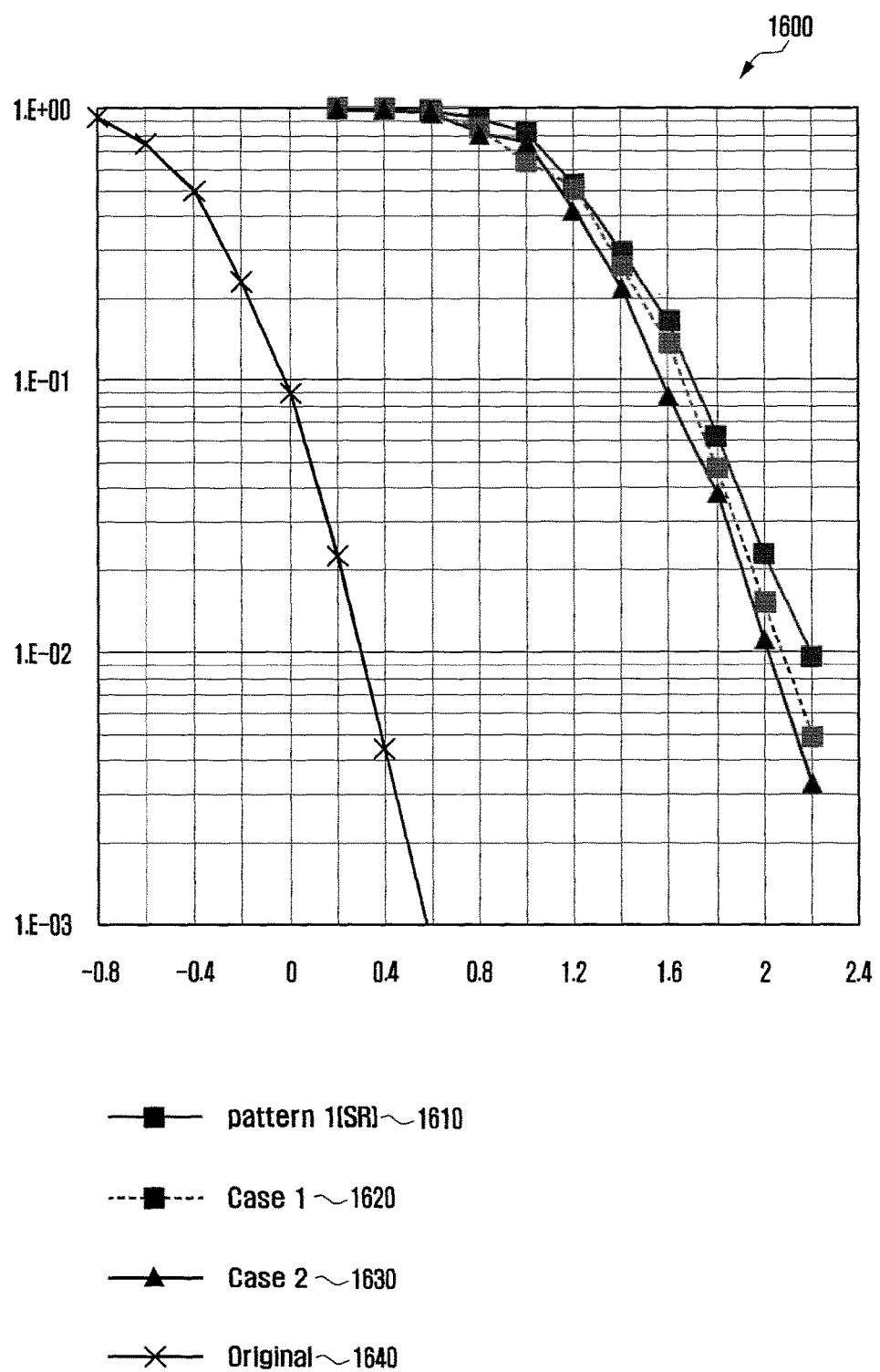
FIG. 16 is a graph illustrating the performance of a method for generating a codeword.

FIG. 16 is a graph illustrating the performance of a method for generating a codeword.

Referring to FIG. 16, a graph 1600 shows the performance of a puncturing pattern in which the codeword is encoded at a code rate of 2/3 in an Additive White Gaussian Noise (AWGN) channel in the case where information bits are 960, the modulation order is 16, and a doping period is 30.

In the graph 1600, a curve 1610 indicates the performance of a puncturing pattern that is designed by a method (conventional method) for designing a puncturing pattern using the concept of a k-Step Recoverable node that is applied to the puncturing of an LDPC code, and a curve 1620 indicates the performance of a puncturing pattern that is designed so that the size of the punctured node group becomes 13 using a method for generating a codeword according to the present disclosure as illustrated in FIG. 8.

Further, a curve 1630 indicates the performance of a puncturing pattern that is designed so that the size of the punctured node group becomes 25 using a method for generating a codeword according to the present disclosure as illustrated in FIG. 8, and a curve 1640 indicates the performance for the original codeword.

Through the graph 1600, it can be confirmed that the method 1620 according to the present disclosure has improved the performance by about 0.1 dB at the Frame Error Rate (FER) of $10^{-2}$ in comparison to the conventional method 1610. Further, it can be confirmed that the method 1630 according to the present disclosure has improved the performance by about 0.2 dB at the Frame Error Rate (FER) of $10^{-2}$ in comparison to the conventional method 1610.

Further, through the graph 1600, it can be confirmed that all the three methods 1610, 1620, and 1630 do not generate an error floor up to the FER of $10^{-3}$.

Figure 17:
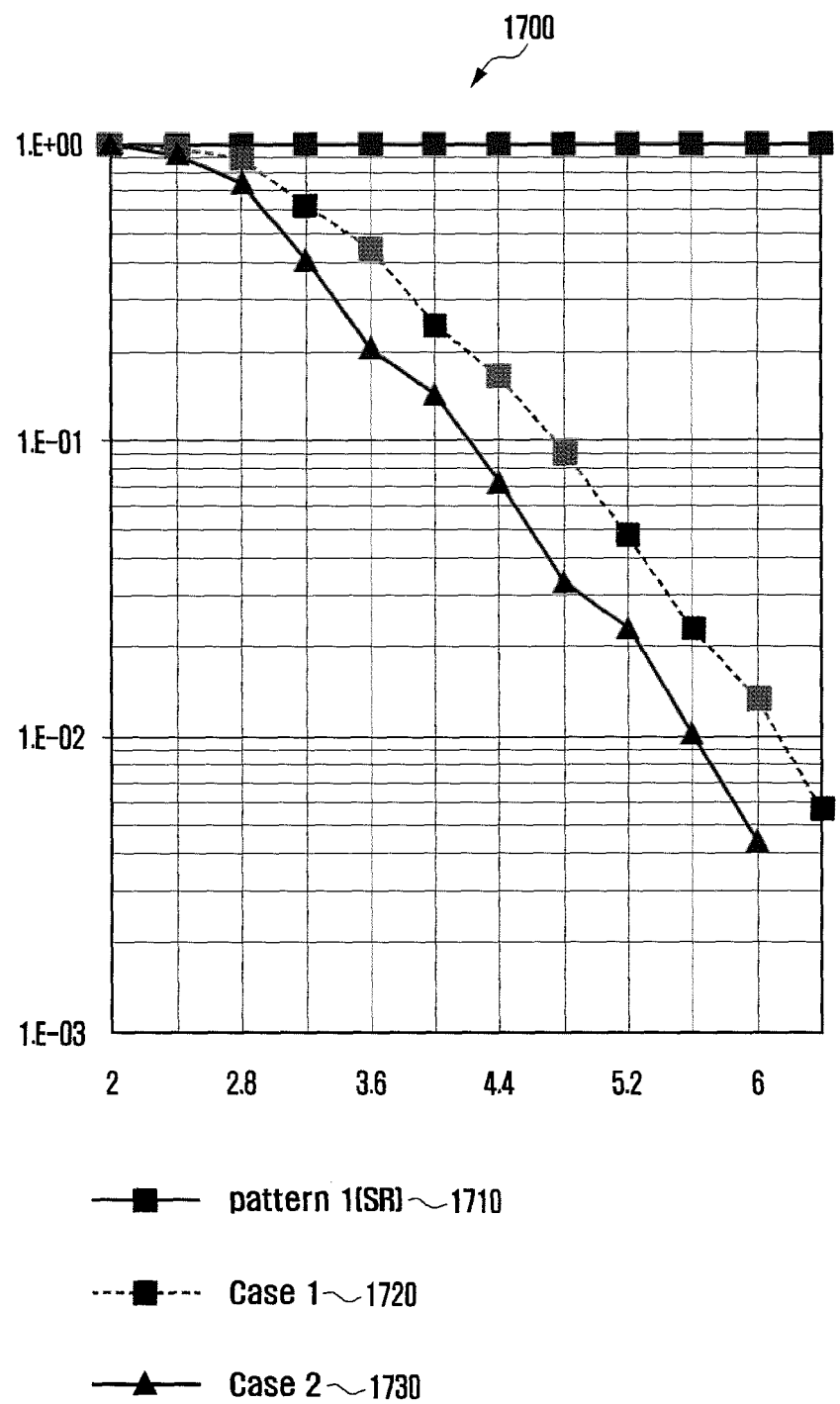
FIG. 17 is another graph illustrating the performance of a method for generating a codeword.

FIG. 17 is another graph illustrating the performance of a method for generating a codeword.

Referring to FIG. 17, a graph 1700 shows the performance of a puncturing pattern in which the codeword is encoded at a code rate of 5/6 in an Additive White Gaussian Noise (AWGN) channel in the case where information bits are 960, the modulation order is 16, and a doping period is 30.

In the graph 1700, a curve 1710 indicates the performance of a puncturing pattern that is designed by a method (conventional method) for designing a puncturing pattern using the concept of a k-Step Recoverable node that is applied to the puncturing of an LDPC code, and a curve 1720 indicates the performance of a puncturing pattern that is designed so that the size of the punctured node group becomes 13 using a method for generating a codeword according to the present disclosure as illustrated in FIG. 8.

Further, a curve 1730 indicates the performance of a puncturing pattern that is designed so that the size of the punctured node group becomes 25 using a method for generating a codeword according to the present disclosure as illustrated in FIG. 8.

Through the graph 1700, it can be confirmed that the methods 1720 and 1730 according to the present disclosure do not generate an error floor up to the FER of $10^{-3}$.

Further, through the graph 1700, it can be confirmed that the method 1730 according to the present disclosure has improved the performance by about 0.5 dB at the Frame Error Rate (FER) of $10^{-2}$ in comparison to the method 1720 according to the present disclosure.

Meanwhile, preferred embodiments of the present disclosure disclosed in this specification and drawings are illustrated to present only specific examples in order to clarify the technical contents of the present disclosure and to help understanding of the present disclosure, but are not intended to limit the scope of the present disclosure. It will be apparent to those skilled in the art to which the present disclosure pertains that various modifications may be made on the basis of the technical idea of the present disclosure in addition to the embodiments disclosed herein. The technical features disclosed in the respective embodiments disclosed herein can be embodied in combination with other embodiments.

The invention claimed is:

1. A method for generating a codeword, comprising:
    calculating a number of punctured symbol nodes among symbol nodes included in a codeword;
    puncturing symbol nodes located at even or odd number positions among the symbol nodes included in the codeword;
    calculating a number of symbol nodes which need to be additionally punctured based on the calculated number of the symbol nodes to be punctured;
    classifying the symbol nodes, which need to be additionally punctured, into one or more punctured node groups based on the calculated number of symbol nodes which need to be punctured;
    determining locations on the codeword where the one or more punctured node groups are to be arranged; and
    puncturing the symbol nodes included in the codeword which belong to the punctured node groups according to the determined locations.

2. The method of claim 1, wherein the calculating the number of punctured symbol nodes comprises calculating the number of punctured symbol nodes among the symbol nodes included in the codeword based on a current code rate and a first target code rate of the codeword.

3. The method of claim 2, further comprising:
calculating the number of punctured nodes to be unpunctured in the codeword for conversion of the first target code rate into a second target code rate; and
unpuncturing the punctured nodes in the codeword according to the calculated number of punctured nodes,
wherein the punctured nodes that belong to the punctured node group are first unpunctured.

4. The method of claim 2, further comprising:
confirming whether the first target code rate is smaller than 2/3; and
if the first target code rate is smaller than 2/3, puncturing the symbol nodes included in the codeword so that the punctured nodes are uniformly arranged on the codeword,
wherein if the first target code rate is not smaller than 2/3, the symbol nodes located at the even or odd number positions are punctured.

5. The method of claim 1, wherein the symbol nodes to be punctured among the symbol nodes located at the even or odd number positions are determined based on locations of doping symbols included in the codeword,
wherein sizes of at least two of the one or more punctured node groups are equal to each other,
wherein each of the one or more punctured node groups is arranged in a center of a symbol band of the codeword,
wherein a plurality of punctured node groups are arranged on at least one of symbol bands of the codeword,
wherein the number of punctured node groups arranged on symbol bands is determined based on at least one of a doping symbol or a target code rate of the codeword, and
wherein the number of punctured node groups arranged on at least one of symbol bands of the codeword is different from the number of punctured node groups arranged on another symbol band.

6. The method of claim 1, wherein the classifying the symbol nodes into the one or more punctured node groups comprising:
classifying the symbol nodes into the one or more punctured node groups further based on at least one of a size and a number of symbol bands of the codeword; and
classifying the symbol nodes into the one or more punctured node groups further based on a size of the punctured node group that is determined according to a predetermined value.

7. The method of claim 1, further comprising:
encoding data;
interleaving the encoded data;
generating the codeword through insertion of doping symbols into the interleaved data;
modulating the codeword; and
transmitting the modulated codeword.

8. An apparatus for generating a codeword, comprising:
an encoder configured to calculate a number of punctured symbol nodes among symbol nodes included in a codeword, puncture symbol nodes located at even or odd number positions among the symbol nodes included in the codeword, calculate a number of symbol nodes which need to be additionally punctured based on the calculated number of the symbol nodes to be punctured, classify the symbol nodes, which need to be additionally punctured, into one or more punctured node groups based on the calculated number of symbol nodes which need to be punctured, determine the locations on the codeword where the one or more punctured node groups are to be arranged, and puncture the symbol nodes included in the codeword which belong to the punctured node groups according to the determined locations; and
a transmission unit which transmits the codeword.

9. The apparatus of claim 8, wherein the encoder is configured to calculate the number of punctured symbol nodes among the symbol nodes included in the codeword based on a current code rate and a first target code rate of the codeword.

10. The apparatus of claim 9, wherein the encoder is configured to calculate the number of punctured nodes to be unpunctured in the codeword for conversion of the first target code rate into a second target code rate, and unpunctures the punctured nodes in the codeword according to the calculated number of punctured nodes, and
wherein the punctured nodes that belong to the punctured node group are first unpunctured.

11. The apparatus of claim 9, wherein the encoder is configured to confirm whether the first target code rate is smaller than 2/3, puncture the symbol nodes included in the codeword so that the punctured nodes are uniformly arranged on the codeword if the first target code rate is smaller than 2/3, and puncture the symbol nodes located at the even or odd number positions if the first target code rate is not smaller than 2/3.

12. The apparatus of claim 8, wherein the symbol nodes to be punctured among the symbol nodes located at the even or odd number positions are determined based on locations of doping symbols included in the codeword,
wherein sizes of at least two of the one or more punctured node groups are equal to each other,
wherein each of the one or more punctured node groups is arranged in a center of a symbol band of the codeword,
wherein a plurality of punctured node groups are arranged on at least one of symbol bands of the codeword,
wherein the number of punctured node groups arranged on symbol bands is determined based on at least one of a doping symbol or a target code rate of the codeword, and
wherein the number of punctured node groups arranged on at least one of symbol bands of the codeword is different from the number of punctured node groups arranged on another symbol band.

13. The apparatus of claim 8, wherein the encoder is configured to classify the symbol nodes into the one or more punctured node groups further based on at least one of a size or a number of symbol bands of the codeword, and
wherein the encoder is configured to classify the symbol nodes into the one or more punctured node groups further based on a size of the punctured node group that is determined according to a predetermined value.

14. The apparatus of claim 8, wherein the encoder comprises:
a binary encoder configured to encode data;
an interleaver configured to interleave the encoded data; and
an inner encoder configured to generate the codeword through insertion of doping symbols into the interleaved data,
wherein the inner encoder is configured to calculate the number of punctured symbol nodes among symbol nodes included in the generated codeword, puncture symbol nodes located at even or odd number positions among the symbol nodes included in the codeword, calculate the number of symbol nodes which need to be additionally punctured based on the calculated number of the symbol nodes to be punctured, classify the symbol nodes, which need to be additionally punctured, into one or more punctured node groups based on the calculated number of symbol nodes which need to be punctured, determine the locations on the codeword where the one or more punctured node groups are to be arranged, and puncture the symbol nodes included in the codeword which belong to the punctured node groups according to the determined locations.

15. The apparatus of claim 8, further comprising a modulation unit configured to modulate the codeword, wherein the transmission unit transmits the modulated codeword.

16. A method for recovering a codeword, comprising:

receiving a codeword, wherein the received codeword is generated by puncturing symbol nodes located at even or odd number positions among symbol nodes included in the codeword, classifying the symbol nodes, which need to be additionally punctured, into one or more punctured node groups, and puncturing the symbol nodes which belong to the punctured node groups according to the locations on the codeword where the one or more punctured node groups are arranged;

demodulating the received codeword; and decoding the demodulated codeword.

17. The method of claim 16, wherein the decoding comprising:

decoding the demodulated codeword using doping symbols included in the codeword; and performing a Bahl Cocke Jelinek Raviv (BCJR) algorithm using forward/backward recursion, wherein the symbol node included in the codeword is decoded using message values of symbol nodes that are in front and in the rear of the symbol node.

18. A receiver comprising:

a reception unit configured to receive a codeword;

a demodulation unit configured to demodulate the received codeword; and a decoder configured to decode the demodulated codeword, wherein the received codeword is generated by puncturing symbol nodes located at even or odd number positions among symbol nodes included in the codeword, classifying the symbol nodes, which need to be additionally punctured, into one or more punctured node groups, and puncturing the symbol nodes which belong to the punctured node groups according to the locations on the codeword where the one or more punctured node groups are arranged.

19. The receiver of claim 18, wherein the decoder is configured decode the demodulated codeword using doping symbols included in the codeword.

20. The receiver of claim 18, wherein the decoder is configured decode the codeword through performing of a Bahl Cocke Jelinek Raviv (BCJR) algorithm using forward/backward recursion, wherein the symbol node included in the codeword is decoded using message values of symbol nodes that are in front and in a rear of the symbol node.

* * * * *